(12) United States Patent
Sadeghian Marnani (10) Patent No.: US 10,852,641 B2
(45) Date of Patent: Dec. 1, 2020

(54) THERMAL NANOLITHOGRAPHY METHOD AND SYSTEM (71) Applicant: Nederlandse Organisatie voor toegepast-natuurwetenschappelijk onderzoek TNO, s-Gravenhage (NL)

(72) Inventor: Hamed Sadeghian Marnani, Nootdorp (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/472,662

(22) PCT Filed: Dec. 21, 2017

(86) PCT No.: PCT/NL2017/050867
§ 371 (c)(1),
(2) Date: Jun. 21, 2019

(87) PCT Pub. No.: WO2018/117836
PCT Pub. Date: Jun. 28, 2018

(65) Prior Publication Data
US 2019/0361356 A1 Nov. 28, 2019

(30) Foreign Application Priority Data

Dec. 23, 2016 (EP) .................................. 16206695

(51) Int. Cl.
G03F 7/20 (2006.01)
G01Q 80/00 (2010.01)

(52) U.S. Cl.
CPC ......... G03F 7/70191 (2013.01); G01Q 80/00 (2013.01)

(58) Field of Classification Search
CPC ....... G03F 7/00; G03F 7/70191; G01Q 60/58; G01Q 80/00
See application file for complete search history.

(56) References Cited

U.S. PATENT DOCUMENTS

| 6,950,385 B1 * | 9/2005 | Chiba | G11B 7/0045 369/100 |
| 2009/0313729 A1 * | 12/2009 | Ando | G01Q 10/065 850/33 |

(Continued)

OTHER PUBLICATIONS

Alexander A. Milner et al., "Floating Tip Nanolithography," Nano Letters, vol. 8, No. 7, pp. 2017-2022, XP055382137 (Jul. 1, 2008).

(Continued)

Primary Examiner — David E Smith
(74) Attorney, Agent, or Firm — Leydig, Voit & Mayer, Ltd.

(57) ABSTRACT

A system for thermal nanolithography comprises a cantilever (13) with a nanoscale tip (14) in proximity to a substrate surface (22). A probe light beam (L1) is reflected off the cantilever (13) and the reflected beam (R1) is measured to determine an atomic force interaction (F) between the tip (14) and the substrate surface (22). The tip (14) is heated to cause a heat-induced change at a localized part (22a) of the substrate surface (22) in proximity to the tip (14) by a heat flow (H) from the tip (14) to said localized part (22a). As described herein, the tip (14) is heated by absorption (A2) of a second, heat-inducing light beam (L2) that is distinct from the probe light beam (L1), in particular having a distinct wavelength (λ2) or other properties.

20 Claims, 6 Drawing Sheets (56) References Cited

U.S. PATENT DOCUMENTS

| | | | |
|---|---|---|---|
| 2010/0042356 A1* | 2/2010 | Kjoller | G01Q 30/04 |
| | | | 702/136 |
| 2010/0132078 A1* | 5/2010 | Hoen | G01Q 60/32 |
| | | | 850/37 |
| 2016/0231656 A1* | 8/2016 | Holzner | G03F 7/70775 |
| 2017/0003602 A1* | 1/2017 | Duerig | G03F 7/7045 |

OTHER PUBLICATIONS

H.J. Mamin et al., "Thermomechanical Writing With an Atomic Force Microscope Tip," Applied Physics Letters, vol. 61, No. 8, pp. 1003-1005, XP000304980 (Aug. 24, 1992).

European Patent Office, International Search Report in corresponding International Application No. PCT/NL2017/050867, dated Apr. 18, 2018 (1 page).

* cited by examiner

THERMAL NANOLITHOGRAPHY METHOD AND SYSTEM

CROSS-REFERENCE TO RELATED APPLICATIONS

This patent application is a U.S. National Phase of PCT International Application No. PCT/NL2017/050867, filed Dec. 21, 2017, which claims priority to European Application No. 16206695.5, filed Dec. 23, 2016, which are both expressly incorporated by reference in their entireties, including any references contained therein.

TECHNICAL FIELD AND BACKGROUND

The present disclosure relates to a method for thermal nanolithography and corresponding system.

For example, EP 2 848 997 A1 describes a scanning probe nanolithography system comprising a probe to create nanostructures line by line through writing said nanostructures pixel by pixel along lines on a sample. A positioning system is adapted to provide a positioning of the probe at a sequence of predetermined positions to the sample and its surface towards the probe and a control unit is provided to control the positioning system for positioning the probe for a pixel wise writing of said lines through a writing unit. It further comprises a sensor unit adapted to detect a predetermined property of the written nanostructure, the sensor unit being connected to the control unit to adapt the control signals to be provided to the writing unit for writing the following line based on the measured signals of the predetermined property.

Unfortunately, heating of the tip can be difficult and typically requires expensive adaptations. It is desired to improve the known methods and systems wherein nanolithography may be performed with more conventional means. It is also desired to overcome limitations of nanolithography with static control modes.

SUMMARY

A first aspect of the present disclosure provides a method for thermal nanolithography. The method comprises providing a cantilever with a nanoscale tip in proximity to a substrate surface. A probe light beam is reflected off the cantilever and the reflected beam is measured to determine an atomic force interaction between the tip and the substrate surface. The tip is heated to cause a heat-induced change at a localized part of the substrate surface in proximity to the tip by a heat flow from the tip to said localized part. Advantageously, the tip is heated by absorption of a second, heat-inducing light beam that is distinct from the probe light beam.

By providing distinct light beams for probing and heating, each may be adapted for the specific task. Accordingly, a standard AFM probe can be used, e.g. without requiring an integrated heating element. By using a heat-inducing light beam with a distinct wavelength, it can be adapted for maximal absorption instead of reflection as is conventional for the probe light beam. For example, by impinging the probe beam at an area of the cantilever having a high reflection coefficient while the heat-inducing light beam is absorbed at an area having a relatively low reflection coefficient, the probe beam may be primarily reflected while the heat-inducing light beam is primarily absorbed. Also other properties of the second beam may be distinct from the probe beam to maximize absorption, such as position, polarization, pulse length, intensity, angle of incidence, etcetera. Advantageously, the present methods and systems may be used in combination with various AFM modes, in particular dynamic AFM.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

The invention is described more fully hereinafter with reference to the accompanying drawings, in which embodiments of the invention are shown. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

Figure 1:
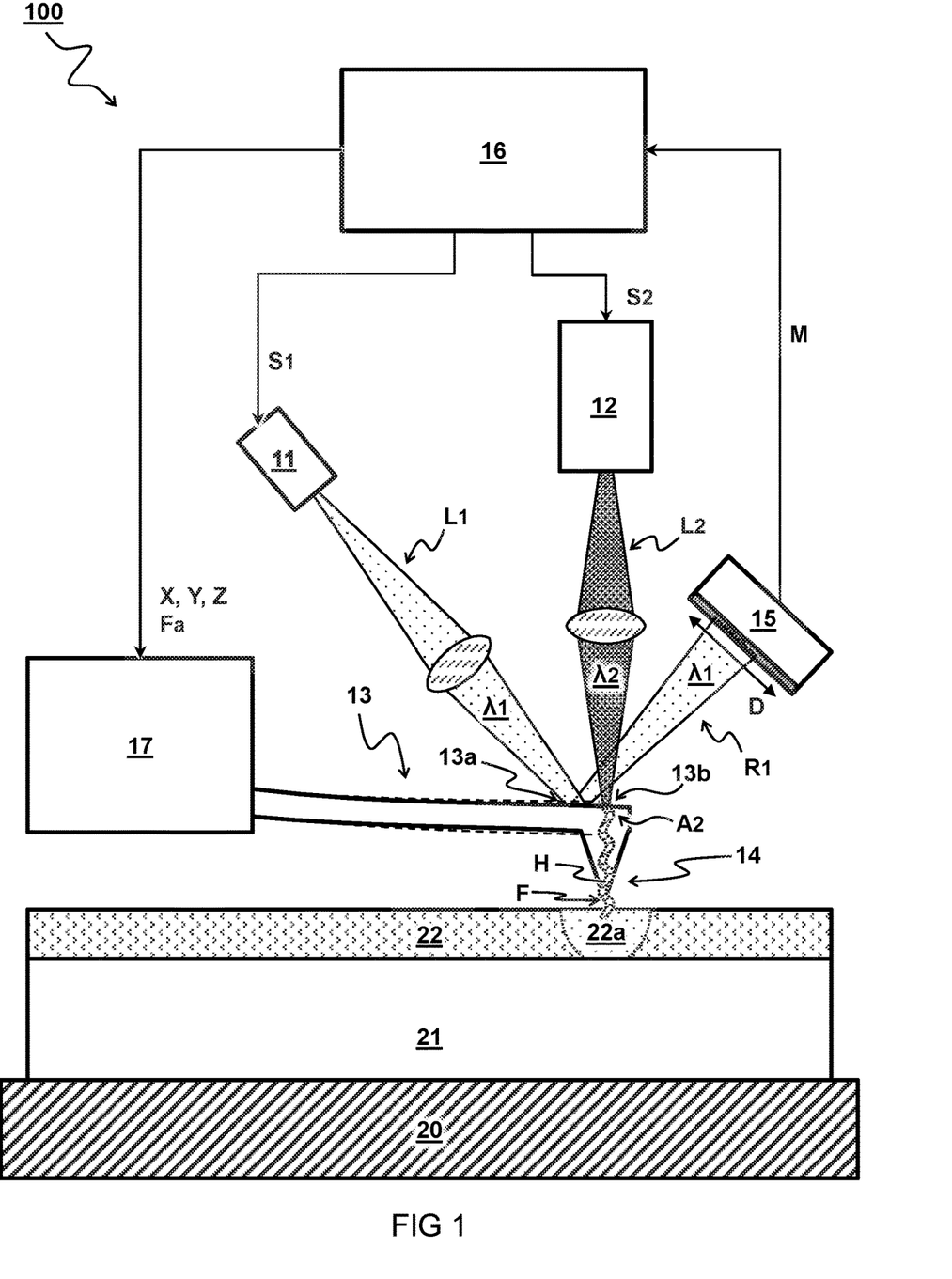
FIG. 1 schematically shows an embodiment of a nanolithography method and system.

FIG. 1 schematically shows an embodiment of a nanolithography method and system 100.

Typically, the system comprises a cantilever 13 with a nanoscale tip 14 in proximity to a substrate surface 22. For example, an AFM cantilever with AFM tip can be used. A probe light beam "L1" is reflected off the cantilever 13 and the reflected beam "R1" is measured to determine an atomic force interaction "F" between the tip 14 and the substrate surface 22. In addition, the tip 14 is heated to cause a heat-induced change at a localized part 22a of the substrate surface 22 in proximity to the tip 14 by a heat flow "H" from the tip 14 to said localized part 22a. Preferably, the tip 14 is heated by absorption "A2" of a second, heat-inducing light beam "L2" that is distinct from the probe light beam "L1". In some embodiments, the second, heat-inducing light beam "L2" has a second wavelength λ2 that is distinct from a wavelength λ1 of the probe light beam "L1".

Typically, absorption "A2" of the heat-inducing light beam "L2" causes the heat flow "H" between the back of the cantilever 13 where the heat-inducing light beam "L2" is absorbed, via the tip 14 to the substrate surface 22. Material at the substrate surface 22 may thus react to the heat flow "H" at the localized part 22a below the tip 14. For example, the localized part 22a spans an area of the substrate surface 22 directly below the tip, e.g. the localized part 22a spans an area up to hundred square nanometers, preferably no more than fifty square nanometer or less, e.g. between one and ten square nanometers. The localized part 22a may thus be affected by the heat, e.g. a thermal, thermos-chemical, and/or thermos-mechanical interaction with the tip 14. For example, the heat flow "H" causes a chemical decomposition or ablation at the localized part 22a.

In one embodiment, the probe light beam "L1" is reflected at a first area 13a of the cantilever 13. Preferably, the first area 13a has a relatively high reflection coefficient at a wavelength λ1 of the probe light beam "L1", e.g. more than fifty percent of the probe light beam "L1" is reflected by the cantilever 13, preferably more than eighty or ninety percent.

In another or further embodiment, the heat-inducing light beam "L2" is absorbed at a second area 13b of the cantilever 13. Preferably the second area 13b has a relatively low reflection coefficient at a wavelength λ2 of the heat-inducing light beam "L2", e.g. less than fifty percent of the heat-inducing light beam "L2" is reflected by the cantilever 13, preferably less than twenty or ten percent. Additionally, or alternatively, the cantilever 13 at the second area 13b has a relatively high absorption coefficient at a wavelength λ2 of the heat-inducing light beam "L2", e.g. more than fifty percent of the heat-inducing light beam "L2" is absorbed by the cantilever 13, preferably more, e.g. at least eighty or ninety percent. In some embodiments, the heat-inducing light beam "L2" has an angle of incidence close to the normal of the cantilever surface, e.g. within twenty, ten, five, or one degrees. This can have the advantage that the substantially the same spot is illuminated, in particular when the cantilever is vibrated.

Preferably, the cantilever 13 does not substantially transmit light of the probe light beam "L1" or heat-inducing light beam "L2" to the substrate surface 22. For example less than ten percent of the probe light beam "L1" and/or heat-inducing light beam "L2" directly reaches the substrate surface 22, preferably less than five or one percent. Accordingly, the heat flow "H" is primarily caused by the absorption "A2" of the heat-inducing light beam "L2", e.g. more than eighty percent of the heat flow "H" results from the heat-inducing light beam "L2", preferably more than ninety percent or more.

In the embodiment shown, a deflection "D" of the reflected beam "R1" may vary as a function of the atomic force interaction "F". In some embodiments, the reflected beam "R1" is measured by a position sensitive detector 15, e.g. a quadrant detector. Optionally, light entering the detector 15 is filtered to pass only the first wavelength λ1 of the probe light beam "L1" (not shown). For example light entering the detector 15 is filtered to block the second wavelength λ2 of the heat-inducing light beam "L2". This may avoid interference in some cases.

Typically, a varying position of the reflected beam "R1" on the position sensitive detector 15 is measured as a function of time. In one embodiment, the atomic force interaction "F" is calculated based on a measurement "M" of an amplitude, frequency, and/or phase of the reflected beam "R1", e.g. of its time-dependent deflection "D". In another or further embodiment, a position X,Y,Z of the tip 14 with respect to the substrate surface 22 is controlled based on a measurement "M" of the reflected beam "R1". In a preferred embodiment, the heat-inducing light beam "L2" is controlled based on a measurement M of the reflected beam "R1".

It will be appreciated that the present methods and systems allow various modes of control that may be difficult or impossible with conventional nanolithography systems. In particular, the cantilever 13 can be controlled to operate in a dynamic mode, e.g. tapping mode or non-contact mode. For example, the substrate surface 22 is imaged and/or written while the tip 14 vibrates with respect to the substrate surface 22. Typically, the cantilever 13 is actuated at one or more actuation frequencies "Fa". Alternatively to dynamic mode control, the cantilever 13 can be controlled to operate in a contact mode, e.g. the substrate surface 22 is imaged and/or written while the tip 14 is held statically over the substrate surface 22.

In the embodiment shown, the cantilever 13 is held by a probe head 17. For example the probe head 17 comprises a piezo actuator to actuate the cantilever 13 at the actuation frequency "Fa". Alternatively, or in addition, the cantilever 13 is actuated at the actuation frequency "Fa" by pulsation of the probe light beam "L1" and/or heat-inducing light beam "L2".

In some embodiments, the probe light beam "L1" is emitted from a first light source 11, e.g. laser. In other or further embodiments, the heat-inducing light beam "L2" is emitted from a second light source 12, e.g. second laser. Alternatively to using separate lasers, light of different wavelengths can be produced from a single light source, e.g. using non-linear optics.

In one embodiment, the heat-inducing light beam "L2" has a higher intensity than the probe light beam "L1", e.g. higher by more than a factor two, three, ten, twenty, etc. For example the probe light beam "L1" has an intensity of less than one milliwatt. For example, the heat-inducing light beam "L2" has an intensity of more than ten milliwatt.

In one embodiment, the heat-inducing light beam "L2" has a lower wavelength than the probe light beam "L1". For example, the probe light beam "L1" has a wavelength higher than five hundred nanometers, preferably higher than six hundred nanometers, e.g. between six hundred fifty and thousand nanometers. For example, the heat-inducing light beam "L2" has a wavelength lower than five hundred nanometers, preferably lower than six hundred nanometers, preferably lower than five hundred, e.g. between two and four hundred nanometers. Of course the preferred wavelengths used may depend on the reflection/absorption coefficients of the material at the position of the impinging beams.

In some embodiments, the nanolithography system 100 comprises a substrate holder 20 configured to carry a substrate 21. The system typically comprises a probe head 17 comprising a cantilever 13 with a nanoscale tip 14. For example, the probe head 17 may be moveable relative to the substrate holder 20, and/or vice versa. In some embodiments, the system comprises a controller 16 to control the substrate holder 20 and/or probe head 17 to bring the tip 14 in proximity to the substrate surface 22. For example, a first light source 11 configured to reflect a probe light beam "L1" off the cantilever 13. The system typically comprises a detector 15 configured to measure the reflected beam "R1" to determine an atomic force interaction F between the tip 14 and the substrate surface 22. The tip 14 is heated to cause a heat-induced change at a localized part 22a of the substrate surface 22 in proximity to the tip 14 by a heat flow "H" from the tip 14 to said localized part 22a. As described herein the system preferably comprises a second light source 12 configured to provide a second, heat-inducing light beam "L2" that is distinct from the probe light beam "L1", wherein the heat-inducing light beam "L2" is configured to heat the tip 14 by absorption "A2" thereof.

Figure 2A:
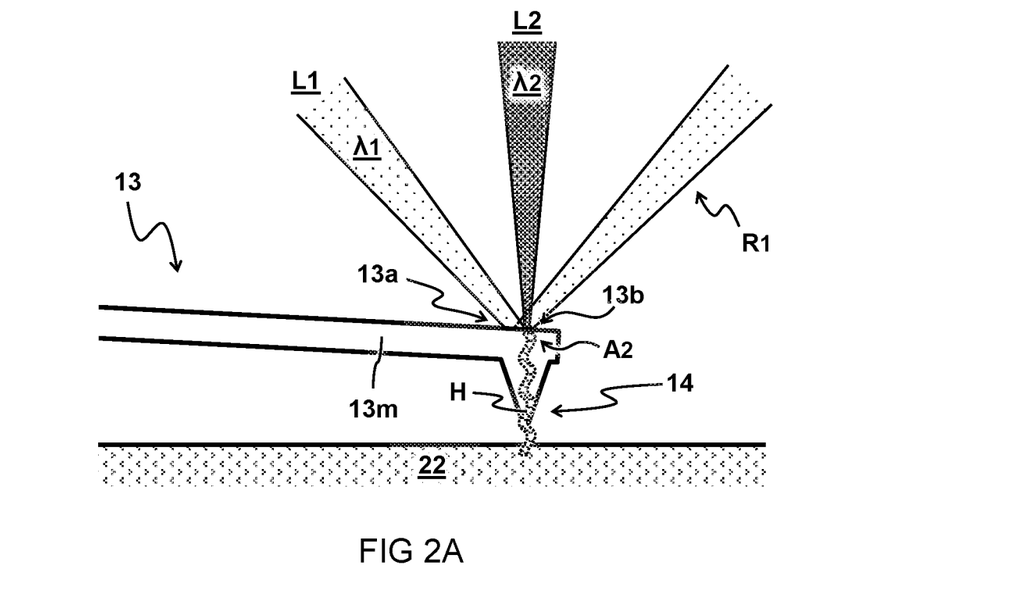
FIGS. 2A and 2B schematically illustrate embodiments of the light beams impinging the cantilever.
Figure 2B:
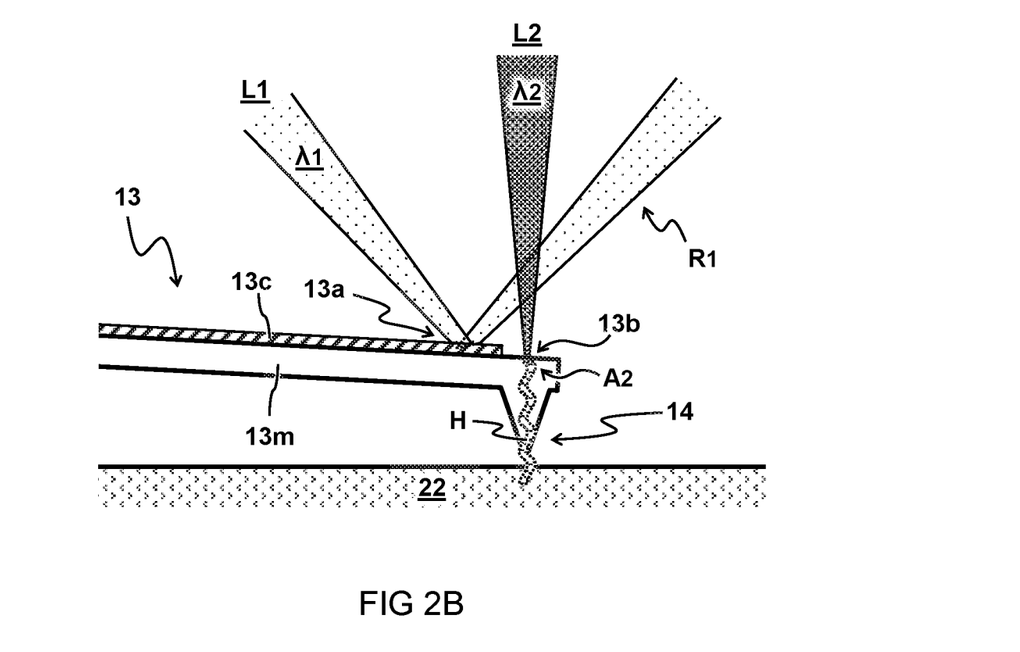

FIGS. 2A and 2B schematically illustrate embodiments of light beams impinging the cantilever.

In a preferred embodiment, as shown, the heat-inducing light beam "L2" illuminates the cantilever 13 wherein heat "H" from the beam only indirectly reaches the tip. For example, the heat-inducing light beam L2 illuminates a top side of the cantilever 13, whereas the tip 14 is at the bottom side of the cantilever 13. This can make e.g. an AFM lithography tool easier to build. Also an influence of the laser on the substrate is less likely because the substrate is shielded from the focused laser by the cantilever. Also, if all the illumination is from one side of the cantilever, this can make parallelization easier. In one embodiment, the area 13b illuminated by the heat-inducing light beam "L2" is on the cantilever 13 at a position directly above the tip 14. For example, a light spot of the heat-inducing light beam "L2" is closer than fifty micrometer from a tip position on the cantilever 13, preferably within thirty, twenty or ten micrometer. The closer the heat-inducing light beam "L2" is to the position above the tip 14, the more effective the transmission of heat "H" there to.

In the embodiment of FIG. 2A, the areas 13a,13b of the probe light beam "L1" and heat-inducing light beam "L2" overlap on the cantilever 13. For example, the cantilever 13 is made from a first material 13m, e.g. silicon. In some embodiments, the probe light beam "L1" is primarily reflected by the material 13m of the cantilever 13 while the heat-inducing light beam "L2" is primarily absorbed by the material 13m of the cantilever 13.

In the embodiment of FIG. 2B, the areas 13a,13b of the probe light beam "L1" and heat-inducing light beam "L2" do not overlap on the cantilever 13. Preferably, the area 13b illuminated by the probe light beam "L1" is further from the tip 14 than the area 13b illuminated by the heat-inducing light beam "L2". For example, a light spot of the probe light beam "L1" is removed more than thirty micrometer from a tip position on the cantilever 13, preferably more than fifty or sixty micrometer.

In some embodiments, the cantilever 13 is coated by a second material 13c, e.g. a gold, silver, or aluminum coating. Preferably, a reflection coefficient of the second material 13c for a wavelength λ1 of the probe light beam is higher than a reflection coefficient of the first material 13m for a wavelength λ2 of the heat-inducing light beam "L2", e.g. higher by a factor of two, three, or more. In one embodiment, the second material 13c covers the first area 13a of the cantilever 13 where the probe light beam "L1" is reflected R1 but not the second area 13b where the heat-inducing light beam "L2" is absorbed A2 to produce the heat flow "H". For example, the first material 13m is exposed to the heat-inducing light beam "L2" at the second area 13b.

Alternatively, or in addition, the second area 13b is coated by a third material (not shown) having a lower reflection coefficient and/or higher absorption coefficient than the first material 13m. Alternatively still, it may be conceivable that the heat-inducing light beam "L2" is absorbed directly by a surface of the tip 14, although this may be harder to achieve that absorption at the cantilever FIGS. 3A-3C schematically illustrate one embodiment of a sequence for nanolithography using a dynamic mode.

Figure 3A:
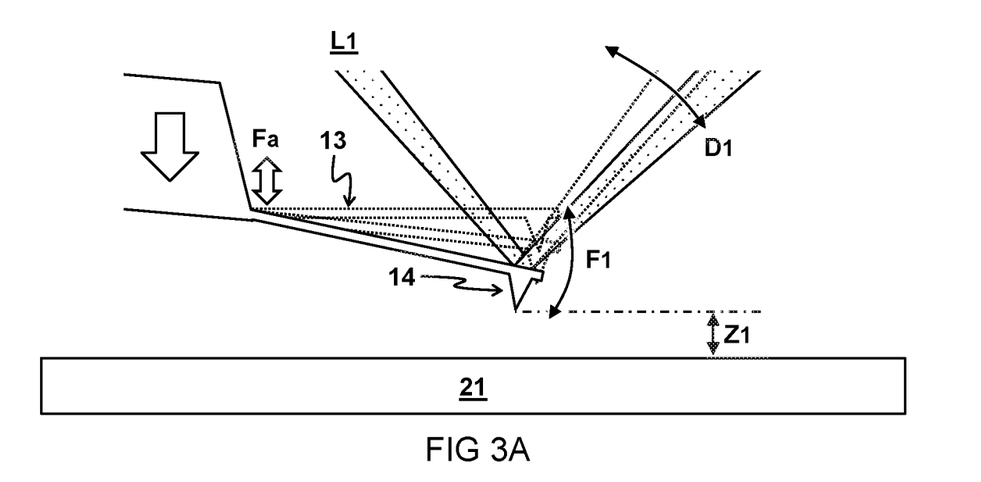
FIGS. 3A-3C schematically illustrate one embodiment of a sequence for nanolithography using a dynamic mode.

As illustrated in FIG. 3A, the cantilever 13 is actuated at an actuation frequency "Fa". The actuation may causes the cantilever 13 to vibrate at a first frequency "F1" when the tip 14 has no interaction with the substrate 21 at a first distance "Z1" between the tip 14 and the substrate 21. The vibration of the cantilever 13 may cause a first deflection "D1" in a reflection of the probe beam "L1" at the first distance "Z1". Various properties may be derived from measuring the deflection. In some embodiments, a measured property of the reflected beam comprises one or more of an amplitude, frequency, and/or phase. For example, the phase of the measured deflection is compared to a phase of the actuation.

Figure 3B:
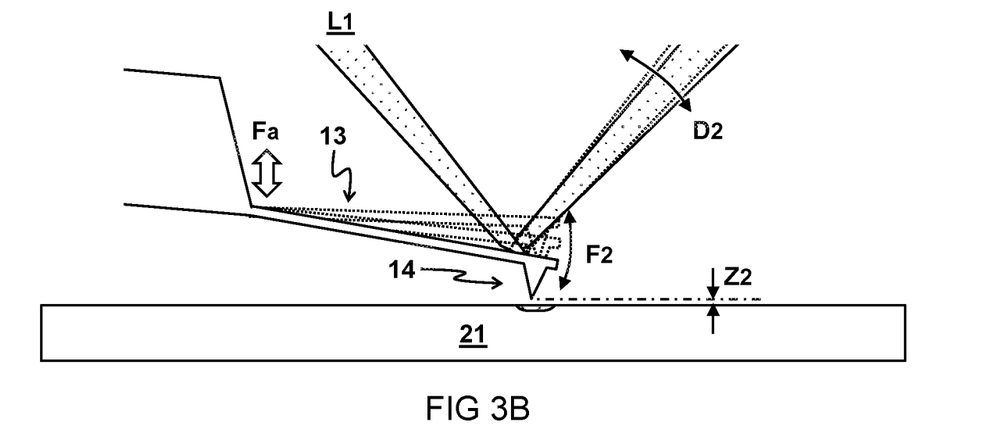

As illustrated in FIG. 3B, the tip 14 is brought in proximity to the substrate 21 from the first distance "Z1" to a closer, second distance "Z2". An interaction of the tip 14 with the substrate 21 at the second distance "Z2" causes the cantilever 13 to vibrate at a second frequency "F2". In one embodiment, the vibration of the cantilever 13 causes a second deflection "D2" in a reflection of the probe beam "L1" at the second distance "Z2". For example, the amplitude, frequency, and/or phase of the cantilever 13 and/or reflected beam changes as a function of the distance "Z1"→"Z2" between the tip 14 and substrate 21. Accordingly, the deflection of the reflected probe light beam "L1" can be used to measure the distance between the tip 14 and substrate 21 while approaching.

Figure 3C:
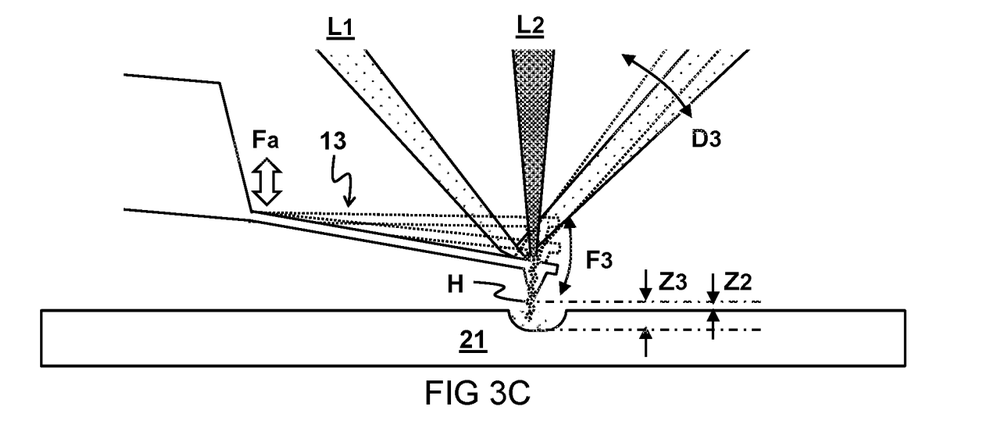

As illustrated in FIG. 3C, the heat-inducing light beam "L2" can be initiated or engaged when it is measured that the tip 14 is at the second distance "Z2" from the substrate 21. Consequently, the heat-inducing light beam "L2" may cause a heat flow "H" that affects the surface of the substrate 21. In some cases, the affected surface causes the cantilever 13 to vibrate at a third frequency "F3". For example, the amplitude, frequency, and/or phase of the cantilever 13 and/or reflected beam changes as a function of a degree in which the surface is affected by the heat flow "H".

In some embodiments, the heat flow causes a change in the topology of the substrate 21 below the tip 14. For example, the substrate 21 is locally removed and/or indented below the tip 14 as a result of the heat flow "H" which causes a changed distance Z3 between the tip 14 and the substrate 21. In other or further embodiments, the heat flow causes a change in the viscoelastic or other properties of the substrate 21 below the tip 14. For example, the viscoelastic properties of the substrate may be dependent on a temperature of the substrate, e.g. the viscoelastic properties of a resist material on the substrate may be affected by a heat-induced chemical change.

In one embodiment, an initial distance of the tip 14 with respect to the substrate 21 is maintained while the heat-inducing light beam "L2" is controlled based on a measurement of the reflected probe light beam "L1". In another or further embodiment, the heat-inducing light beam "L2" is disabled and/or the distance between the tip 14 and substrate 21 increased when a predetermined threshold change in the deflected beam is measured which threshold change is indicative for a desired change of the substrate 21 caused by the heat flow "H".

Figure 4A:
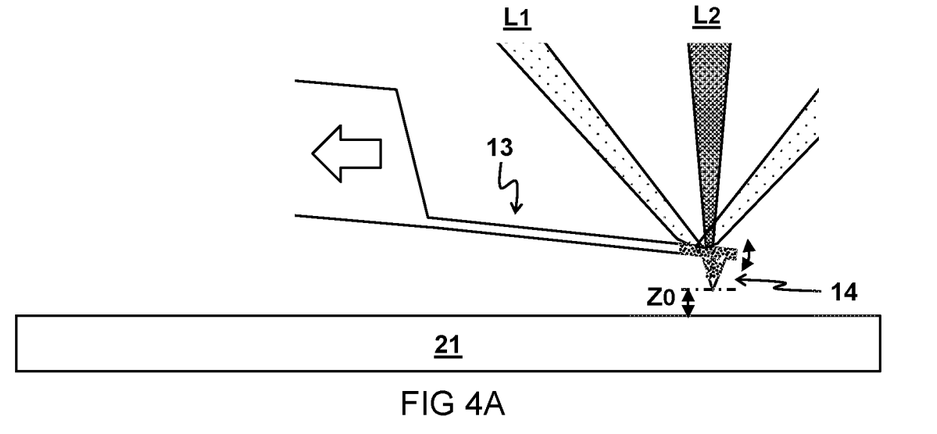
FIGS. 4A-4C schematically illustrate another or further embodiment of a sequence for nanolithography using a dynamic mode.
Figure 4B:
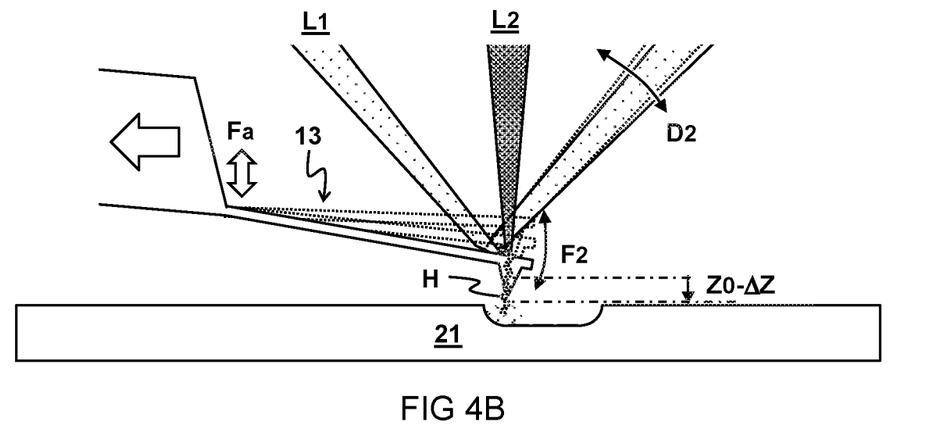
Figure 4C:
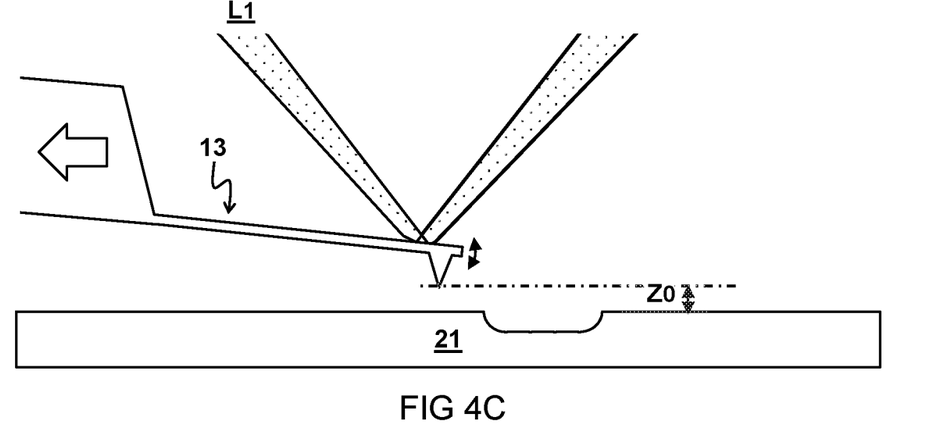

FIGS. 4A-4C schematically illustrate another or further embodiment of a sequence for nanolithography using a dynamic mode.

As illustrated in FIG. 4A, the tip 14 is moved over a surface of the substrate 21 at a proximal distance "Z0" without actuation of the cantilever 13. At this point, the heat-inducing light beam "L2" may or may not be engaged to heat the tip 14. In any case, for the illustrated embodiment, there is little or no heat flow "H" between the tip 14 and the substrate 21 at the proximal distance "Z0" without actuation of the cantilever 13.

As illustrated in FIG. 4B, the cantilever 13 can be actuated at an actuation frequency "Fa". In one embodiment, the actuation causes the tip 14 to vibrate decreasing a minimum distance "Z0−ΔZ" between the tip 14 and substrate 21. In another or further embodiment, the heat flow "H" from the tip 14 to the substrate 21 increases as a result of the decreasing a minimum distance "Z0−ΔZ". In some embodiments, the tip 14 is moved over a surface of the substrate 21 while actuation of the cantilever 13 is varied as a function of position to affect predetermined positions of the substrate 21 by the heat flow "H". In other or further embodiments, a distance and/or velocity of the tip 14 relative to the substrate 21 is controlled based on a measure deflection "D2" to maintain a predetermined heat flow "H" to the substrate 21. For example, when it is measured that the effect of the heat flow on the substrate 21 is too low, the tip 14 may move slower. For example, when it is measured that the effect of the heat flow on the substrate 21 is too high, the tip 14 may move faster. Also other modes of feedback between the measured reflection and control of the heat-inducing light beam can be envisaged. It will be appreciated that this sequence may provide fast control over which areas are written by heat flow.

As illustrated in FIG. 4C, the heat-inducing light beam "L2" may optionally be disengaged when the cantilever 13 is not actuated.

Figure 5A:
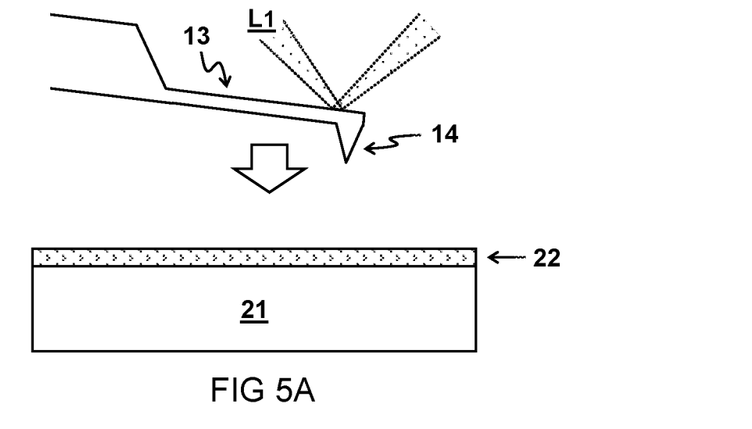
FIGS. 5A-5C illustrate one embodiment of a substrate which can be written by the present methods and systems.
Figure 5B:
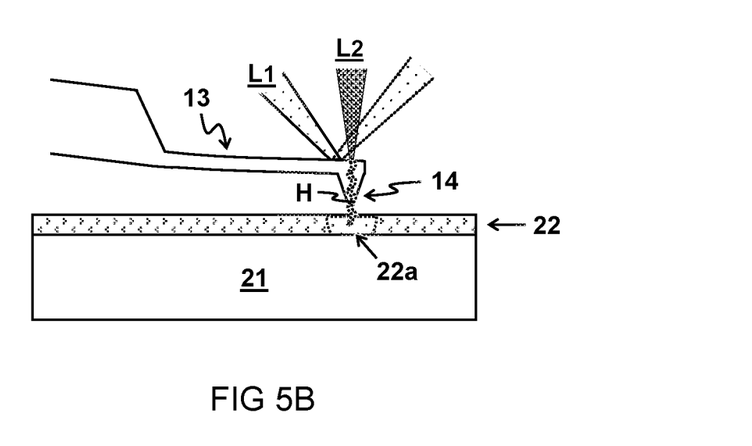
Figure 5C:
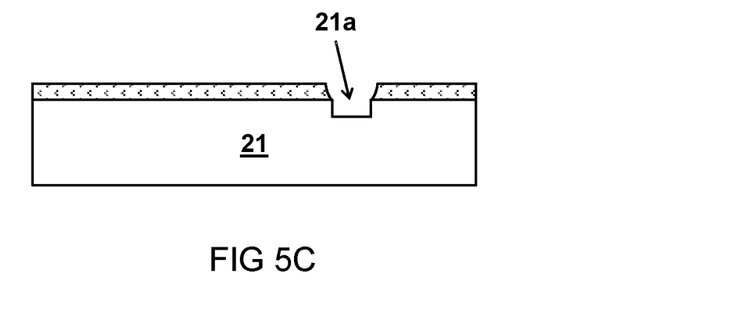

FIGS. 5A-5C illustrate one embodiment of a substrate which can be written by the present methods and systems. In this case, the substrate surface 22 comprises a resist layer.

As illustrated in FIG. 5A, a distance between the tip 14 and substrate surface 22 is lowered while the probe light beam "L1" is reflected off the cantilever 13 for monitoring atomic force interaction F between the tip 14 and substrate surface 22.

As illustrated in FIG. 5B, the resist layer comprises a resist material that reacts to the heat flow "H" at the localized part 22a below the tip 14. In a preferred embodiment, the resist material reacts by self-amplified depolymerization in response to the heat flow "H" from the tip 14. For example, the substrate surface 22 comprises a layer of polyphthalaldehyde PPA or molecular glasses as resist. Preferably the polymer decomposes into volatile monomers upon heating with the tip without the application of mechanical force and without pile-up or residues of the resist.

As illustrated in FIG. 5C, the resist material that has reacted to the heat flow "H" may be removed from an underlying substrate 21. In an alternative embodiment (not shown), the resist material that has reacted to the heat flow "H" remains on the substrate 21. In the embodiment shown, a localized part 21a of the substrate 21 is etched to form a surface feature.

Figure 6A:
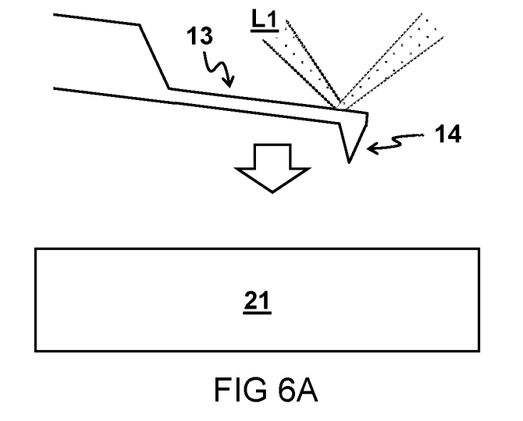
FIGS. 6A-6C illustrate another or further embodiment of a substrate which can be written by the present methods and systems.
Figure 6B:
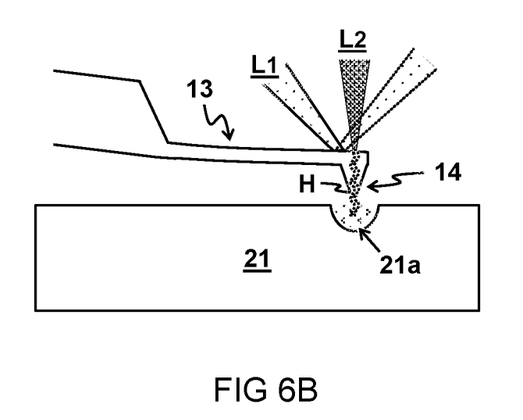
Figure 6C:
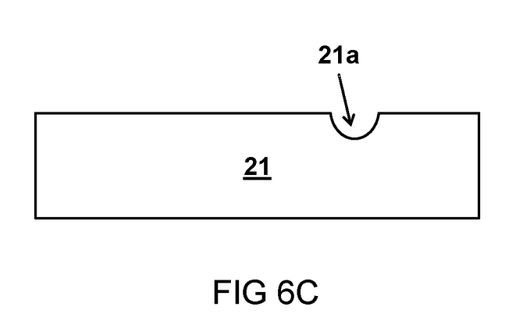

FIGS. 6A-6C illustrate another or further embodiment of a substrate which can be written by the present methods and systems. In this case, the substrate 21 is directly affected by the heat flow "H". In some embodiments, the substrate material reacts to the heat flow "H" at a localized part 21a of the substrate 21 directly below the tip 14, e.g. by indentation, ablation, or evaporation of the substrate material.

For the purpose of clarity and a concise description, features are described herein as part of the same or separate embodiments, however, it will be appreciated that the scope of the invention may include embodiments having combinations of all or some of the features described. For example, while embodiments were shown for different modes of operation (static/dynamic) and different substrates (with/without resist), also alternative ways may be envisaged by those skilled in the art having the benefit of the present disclosure for achieving a similar function and result. E.g. aspects may be combined or split up into one or more alternative components. The various elements of the embodiments as discussed and shown offer certain advantages, such as heat assisted nanolithography using a conventional AFM with an extra laser beam for heating the tip. Of course, it is to be appreciated that any one of the above embodiments or processes may be combined with one or more other embodiments or processes to provide even further improvements in finding and matching designs and advantages. It is appreciated that this disclosure offers particular advantages to nanolithography, and in general can be applied for any application wherein it is desired to provide separate control over measurement and heating of an AFM probe.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A method for thermal nanolithography, the method comprising:
   providing a cantilever with a nanoscale tip in proximity to a substrate surface;
   reflecting a probe light beam off an area of the cantilever and measuring a reflection of the probe light beam off the area of the cantilever to determine an atomic force interaction between the nanoscale tip and the substrate surface; and
   illuminating an area on a back of the cantilever directly above the nanoscale tip with a second, heat-inducing, light beam, that is distinct from the probe light beam, wherein a material on the area on the back of the cantilever has an absorption coefficient absorbing more than fifty percent at a wavelength of the second, heat-inducing, light beam, to cause a heat flow between the back of the cantilever where the second, heat-inducing light beam is absorbed, via the nanoscale tip to the substrate surface to cause a heat-induced change at a localized part of the substrate surface in proximity to the nanoscale tip by the heat flow from the nanoscale tip to said localized part.

2. The method according to claim 1, wherein the second, heat-inducing, light beam has a second wavelength that is distinct from a wavelength of the probe light beam.

3. The method according to claim 1, wherein the cantilever is controlled to operate in a dynamic mode.

4. The method according to claim 1, wherein the second, heat-inducing, light beam has a lower wavelength than the probe light beam.

5. The method according to claim 1, wherein the second, heat-inducing, light beam is controlled based on a measurement of the reflected beam.

6. The method according to claim 1, wherein the area illuminated by the probe light beam is further from the tip than the area illuminated by the second, heat-inducing, light beam.

7. The method according to claim 1, wherein the cantilever comprises a first material and a second material,
wherein:
the first material is positioned on the area on the back of the cantilever to absorb the second, heat-inducing, light beam, and
the second material is positioned on the area of the cantilever to reflect the probe light beam, and
wherein a reflection coefficient of the second material for a wavelength of the probe light beam is higher than a reflection coefficient of the first material for a wavelength of the second, heat-inducing, light beam.

8. The method according to claim 7, wherein the second material covers a first area of the cantilever where the probe light beam is reflected but not a second area on the back of the cantilever where the second, heat-inducing, light beam is absorbed to produce the heat flow.

9. The method according to claim 1, wherein the second, heat-inducing, light beam is engaged when it is measured that the nanoscale tip is at a specified distance from the substrate.

10. The method according to claim 1, wherein the nanoscale tip is moved over a surface of the substrate while an actuation of the cantilever is varied as a function of position to affect predetermined positions of the substrate by the heat flow.

11. The method according to claim 1, wherein the cantilever does not substantially transmit light of the probe light beam or heat-inducing light beam to the substrate surface.

12. A method for thermal nanolithography, the method comprising:
providing a cantilever with a nanoscale tip in proximity to a substrate surface;
reflecting a probe light beam off the cantilever and measuring a reflection of the probe light beam off the cantilever to determine an atomic force interaction between the nanoscale tip and the substrate surface; and
heating the nanoscale tip to cause a heat-induced change at a localized part of the substrate surface in proximity to the nanoscale tip by a heat flow from the nanoscale tip to said localized part;
wherein the nanoscale tip is heated by an absorption of a second heat-inducing, light beam that is distinct from the probe light beam,
wherein an area illuminated by the second, heat-inducing, light beam is on the cantilever at a position directly above the nanoscale tip, and
wherein the second, heat-inducing, light beam is disabled and/or a distance between the tip and the substrate is increased when a predetermined threshold change in the deflected beam is measured, which threshold change is indicative for a desired change of the substrate caused by the heat flow.

13. A method for thermal nanolithography, the method comprising:
providing a cantilever with a nanoscale tip in proximity to a substrate surface;
reflecting a probe light beam off the cantilever and measuring a reflection of the probe light beam off the cantilever to determine an atomic force interaction between the nanoscale tip and the substrate surface; and
heating the nanoscale tip to cause a heat-induced change at a localized part of the substrate surface in proximity to the nanoscale tip by a heat flow from the nanoscale tip to said localized part;
wherein the nanoscale tip is heated by an absorption of a second, heat-inducing, light beam that is distinct from the probe light beam,
wherein an area illuminated by the second, heat-inducing, light beam is on the cantilever at a position directly above the nanoscale tip, and
wherein a distance and/or velocity of the nanoscale tip relative to the substrate is controlled based on a measure deflection to maintain a predetermined heat flow to the substrate.

14. A nanolithography system comprising
a substrate holder configured to carry a substrate;
a probe head comprising a cantilever with a nanoscale tip;
a controller to control the substrate holder and/or probe head to bring the tip in proximity to the substrate surface;
a first light source configured to reflect a probe light beam off an area of the cantilever;
a detector configured to measure the reflected beam off the area of the cantilever to determine an atomic force interaction between the tip and the substrate surface; and
a second light source configured to provide a second, heat-inducing, light beam that is distinct from the probe light beam,
wherein the heat-inducing light beam is configured to heat an area on a back of the cantilever directly above the nanoscale tip, wherein the area on the back of the cantilever is provided with a material having an absorption coefficient for absorbing more than fifty percent at a wavelength of the second, heat-inducing, light beam, to cause a heat flow between the back of the cantilever where the second, heat-inducing light beam is absorbed, via the nanoscale tip to the substrate surface to cause a heat-induced change at a localized part of the substrate surface in proximity to the nanoscale tip by the heat flow from the nanoscale tip to said localized part.

15. The system according to claim 14, wherein the second, heat-inducing, light beam has a second wavelength that is distinct from a wavelength of the probe light beam.

16. The system according to claim 14, wherein the second, heat-inducing, light beam has a lower wavelength than the probe light beam.

17. The system according to claim 14, wherein the second, heat-inducing, light beam is controlled based on a measurement of the reflected beam.

18. The system according to claim 14, wherein the area illuminated by the probe light beam is further from the tip than the area illuminated by the second, heat-inducing, light beam.

19. The system according to claim 14, wherein the cantilever comprises a first material and a second material, wherein:
  the first material is positioned on the area on the back of the cantilever to absorb the second, heat-inducing, light beam, and
  the second material is positioned on the area of the cantilever to reflect the probe light beam, and
wherein a reflection coefficient of the second material for a wavelength of the probe light beam is higher than a reflection coefficient of the first material for a wavelength of the second, heat-inducing, light beam.

20. The system according to claim 14, wherein the cantilever does not substantially transmit light of the probe light beam or heat-inducing light beam to the substrate surface.

* * * * *